United States Patent
Demirkan et al.

(10) Patent No.: US 12,401,369 B2
(45) Date of Patent: Aug. 26, 2025

(54) CLOSED LOOP DAC ARTIFACT GENERATION

(71) Applicant: Analog Devices International Unlimited Company, Limerick (IE)

(72) Inventors: Murat Demirkan, Istanbul (TR); Michael E. Harrell, Colorado Springs, CO (US); Dennis A. Dempsey, Newport (IE); Zahit Evren Kaya, Izmit (TR)

(73) Assignee: Analog Devices International Unlimited Company, Limerick (IE)

( * ) Notice: Subject to any disclaimer, the term of this patent is extended or adjusted under 35 U.S.C. 154(b) by 105 days.

(21) Appl. No.: 18/227,039

(22) Filed: Jul. 27, 2023

(65) Prior Publication Data

US 2024/0097691 A1 Mar. 21, 2024

Related U.S. Application Data

(60) Provisional application No. 63/376,467, filed on Sep. 21, 2022.

(51) Int. Cl.
*H03M 1/06* (2006.01)
(52) U.S. Cl.
CPC .................. *H03M 1/0617* (2013.01)
(58) Field of Classification Search
CPC ........ H03M 1/0617; H03M 1/12; H03M 1/66; H03M 1/00
USPC .......................... 341/144, 155, 110, 118, 120
See application file for complete search history.

(56) References Cited

U.S. PATENT DOCUMENTS

| | | | |
|---|---|---|---|
| 7,956,786 B2 | 6/2011 | Cosgrave | |
| 12,224,767 B2* | 2/2025 | Cherenkov | H03M 1/181 |
| 2017/0339762 A1* | 11/2017 | Pan | H05B 45/10 |
| 2020/0021891 A1 | 1/2020 | Qi | |
| 2022/0190800 A1 | 6/2022 | Turvey et al. | |
| 2022/0239304 A1* | 7/2022 | Gunasekaran | H03M 1/1033 |
| 2023/0208402 A1* | 6/2023 | Chakraborty | H03D 7/125 |
| | | | 327/527 |

FOREIGN PATENT DOCUMENTS

| | | |
|---|---|---|
| JP | 2002040098 | 2/2002 |
| JP | 2010181367 | 8/2010 |
| JP | 2011013040 | 1/2011 |
| JP | 2014521090 | 8/2014 |
| JP | 2020148544 | 9/2020 |

OTHER PUBLICATIONS

"Japanese Application Serial No. 2023-151148, Notification of Reasons for Refusal mailed May 27, 2025", w/ English Translation, 6 pgs.

* cited by examiner

*Primary Examiner* — Peguy Jean Pierre
(74) *Attorney, Agent, or Firm* — Schwegman Lundberg & Woessner, P.A.

(57) ABSTRACT

A circuit supply system includes a main digital to analog converter (DAC) circuit to produce a direct current (DC) output level at a system output; a feedback circuit path connected to the system output; a primary control circuit path connected to the feedback circuit path and configured to regulate the DC output level at the system output using the main DAC circuit and the feedback circuit path; and a secondary control circuit path connected to the feedback circuit path and configured to add a non-DC signal component to the DC output level and regulate the non-DC signal component using the feedback circuit path.

20 Claims, 8 Drawing Sheets

CLOSED LOOP DAC ARTIFACT GENERATION

CLAIM OF PRIORITY

This application claims priority to U.S. Provisional Application Ser. No. 63/376,467, filed Sep. 21, 2022, which is incorporated by reference herein in its entirety.

FIELD OF THE DISCLOSURE

This document pertains generally, but not by way of limitation, to amplifier systems that provide a regulated circuit supply, and more particularly, to circuit supply systems that can selectively add an artifact signal onto to a regulated circuit supply output.

BACKGROUND

Figure 1:
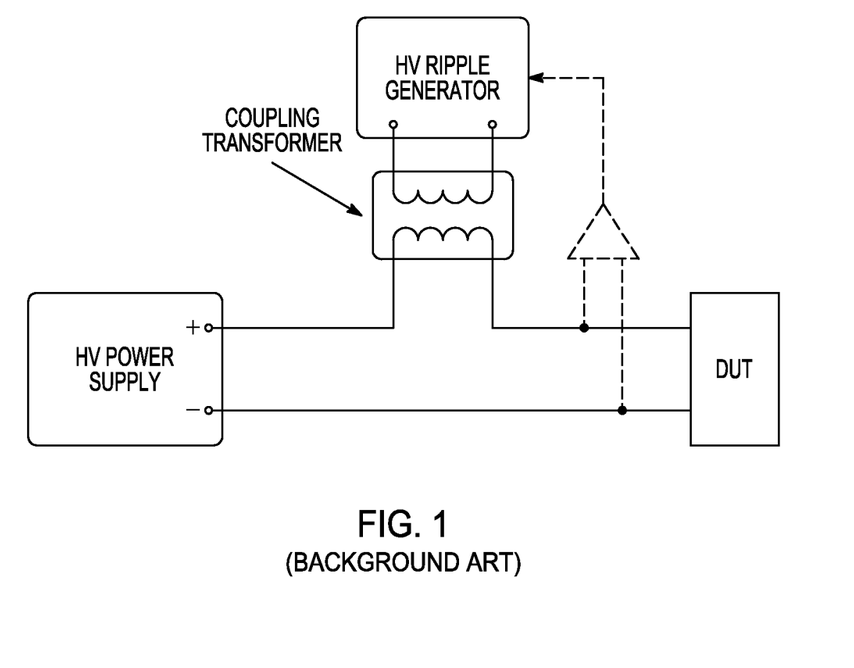
FIG. 1 is an example of a circuit for adding ripple onto a power supply output.

Amplifier systems can be used to provide a direct current (DC) output. These systems can be useful for example in automatic test equipment (ATE). In some ATE applications, it may be desirable to introduce artifacts such as ripple or noise onto the DC output to test device under test (DUT) performance, sensitivity, or reliability under such conditions. For example, electronic components used in electric vehicle (EV) applications are prone to high voltage and current ripples due to the high dynamic noise (or ripple) of the switching power inverters. Introducing artifact signals onto the circuit supply for the electronic components can test the robustness of the electronic components to high voltage and current ripples or noise, and can be used to test the Power Supply Rejection Ratio (PSRR) of the electronic system under test. One approach to one way ripple generation can be achieved using transformer networks. FIG. 1 is an example of a circuit for adding ripple onto a power supply output. A ripple generator and a coupling transformer are placed between the DC power supply and the DUT to couple large AC signals onto the circuit supply. The ripple generator may apply a sinusoidal waveform to the output of the supply and the ripple can be measured at circuit nodes of the system under test. However, transformer networks such as the example of FIG. 1 are bulky, and not very flexible regarding the artifact signals they can generate.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 2:
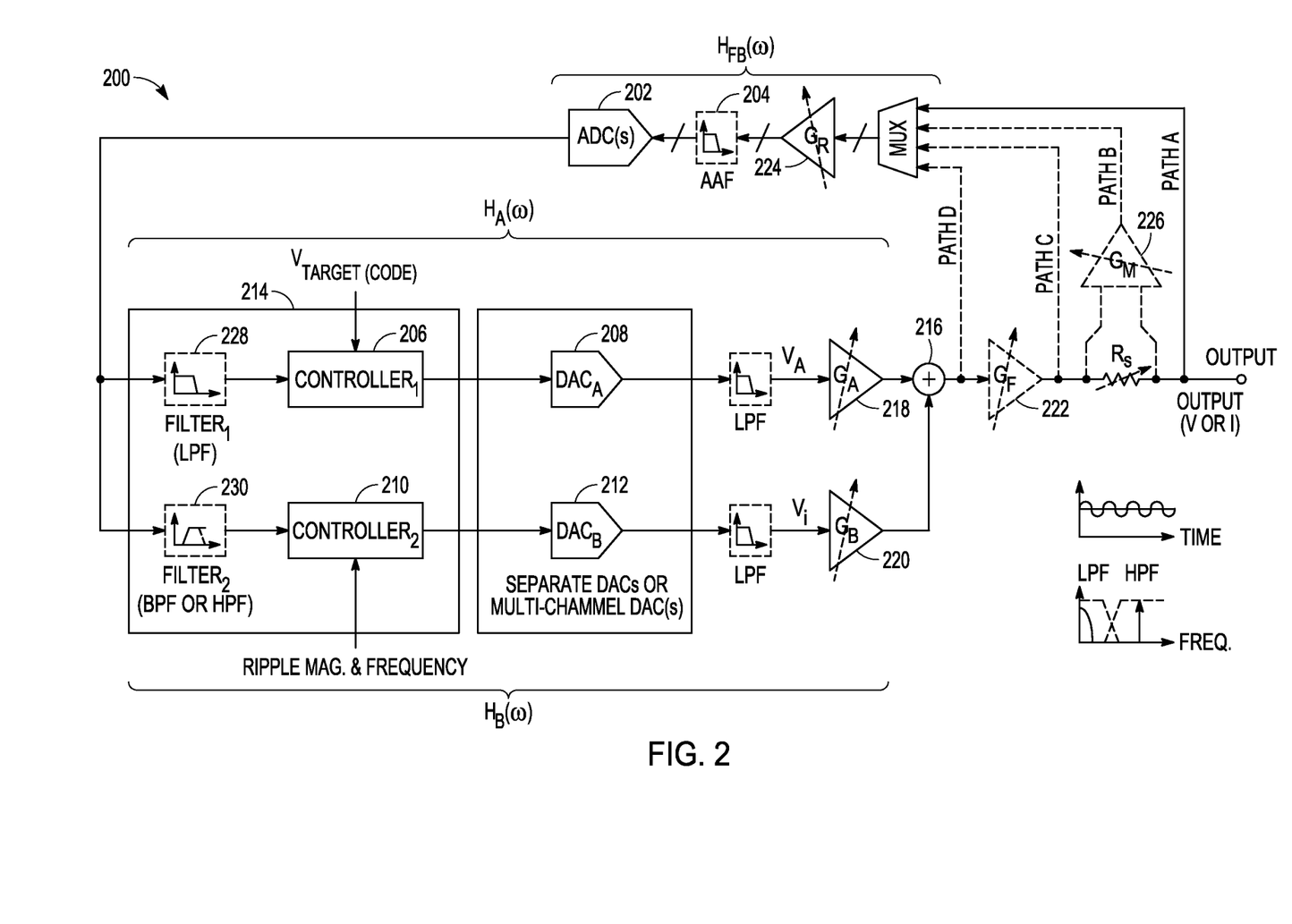
FIG. 2 is a circuit diagram of a circuit supply system having a closed loop architecture.

FIG. 2 is a circuit diagram of an example of a circuit supply system 200 having a closed loop architecture that provides a regulated supply output that can add artificial circuit supply ripple and noise to the output using digital means. No bulky transformer networks are needed.

The system 200 includes primary control circuit path and a secondary control circuit path. The primary control circuit path has the transfer function designated as $H_A(\omega)$ in FIG. 2, and the secondary control circuit path has the transfer function designated as $H_B(\omega)$ in FIG. 2. The primary control circuit path is responsible for maintaining a direct current (DC) output level at the output of the system 200. The DC output level can be a regulated DC output voltage or a regulated DC output current. The secondary control circuit path generates a non-DC signal to add to the DC output level. The non-DC signal can be a ripple signal or a noise signal for example.

The system 200 includes a feedback circuit path coupled from the output of the system to the inputs of both the primary control circuit path and the secondary control circuit path. The feedback circuit path has the transfer function designated as $H_{FB}(\omega)$ in FIG. 2. The feedback circuit path includes an analog to digital converter (ADC) circuit 202 and an optional anti-aliasing filter (AAF) 204. The ADC circuit 202 produces a digital version of the output signal as a feedback signal. The primary control circuit path and the secondary control circuit path use the feedback signal to regulate the DC output level and the non-DC output signal, respectively.

In the example of FIG. 2, the primary control circuit path includes a controller 206 and a digital to analog converter (DAC) circuit 208. The controller 206 can include logic circuits to implement the functions described for the controller 206. DAC circuit 208 is the main DAC circuit that produces the DC output level that may be used by the DUT as a circuit supply. The controller 206 adjusts the DAC code of the DAC circuit 208 to maintain a constant DC output level (e.g., to maintain an output voltage at a target output voltage ($V_{OUT} \approx V_{TARGET}$) or to maintain an output current at a target output current ($I_{OUT} \approx I_{TARGET}$).

The secondary control circuit path includes a second controller 110 and a second DAC circuit 212. The controller 210 adjusts the DAC code of the DAC circuit 212 to introduce the non-DC artifact signal at the output of the system 100. The controllers 206, 210 can be included in a digital domain 214 of the system 100, and the controllers 206, 210 can be implemented as a programmable gate array (PGA), an application specific integrated circuit (ASIC), a processor, a micro controller, a logic state machine, or dedicated digital circuitry. The controllers 206, 212 may also perform adaptive and machine learning methods and algorithms. While the example of FIG. 2 utilizes two independent DAC channels, another approach is for the two control circuit paths to share DAC circuitry. Using two independent DAC channels may minimize crosstalk between the two control circuit paths.

The DC output level from DAC 208 and the non-DC signal from DAC 212 are combined using summing circuit node 216. The primary control circuit path and the secondary control circuit path can include amplifiers 218 and 220 to add gain GA and GB respectively, to the circuit paths. Another amplifier 222 can optionally be included at the output of the summing circuit node 216 to add gain GF to the forward circuit path. The feedback circuit path can include an amplifier 224 with gain (or attenuation) $G_R$ to scale the output down to the input voltage swing limits of the ADC 202. The ADC 202 may measure output voltage or output current. A multiplexer (MUX) can be included to select whether output current or voltage is measured. Output current can be measured using a sense impedance $R_S$ (e.g., a resistor or other impedance circuit element). Another amplifier 226 can be used to provide gain $G_M$ to the measurement of the output. In some examples, a transimpedance amplifier can be used to convert the current signal to a voltage signal.

The primary control circuit path with the feedback circuit path is a primary closed loop with transfer function $H_A(\omega)$ *$H_{FB}(\omega)$ and works to maintain a constant power supply output. The secondary control circuit path may operate in an open loop mode or a closed loop mode. In the open loop mode, the second controller 110 ignores its input from the feedback circuit path and provides a predetermined (e.g., programmed) DAC code to DAC circuit 212 to introduce the non-DC artifact signal (e.g., a ripple signal) into the system. The frequency of the non-DC artifact signal generated by DAC circuit 212 should be sufficiently greater than the bandwidth of the primary control loop (i.e., bandwidth of $H_A(\omega)$*$H_{FB}(\omega)$) so that the non-DC artifact signal does not significantly impact the stability of the primary control loop.

In the closed loop mode, the secondary control circuit path with the feedback circuit path is a secondary closed loop with transfer function $H_B(\omega)$*$H_{FB}(\omega)$ and works to control the magnitude or power of the generated non-DC artifact signal. As in the open loop approach, the primary closed loop and the secondary closed loop should be sufficiently far apart in frequency terms to not interact significantly with each other to maintain stability and precise control by the two closed loops.

For instance, if the bandwidth of the primary closed loop is substantially less than the bandwidth of the secondary closed loop, then a ripple signal generated by DAC circuit 212 may be embedded directly onto the output (voltage or current) without getting filtered by the primary circuit path transfer function, $H_B(\omega)$. In other words, controller 206 adjusts DAC circuit 208 to maintain steady state ($V_{OUT} \approx V_{TARGET}$) while ignoring the artificially introduced ripple by DAC circuit 212, which is desirable for loop stability. Similarly, controller 2010 focuses on maintaining a fixed ripple amplitude at a given frequency. An advantage of this system is that it allows the ripple frequency to be substantially higher than the bandwidth of the primary closed loop, which may be beneficial in some applications.

In some examples, the relative bandwidths of the primary control circuit path and the secondary control circuit path may be adjusted within the controllers 206, 210. For instance, if the primary control circuit path and the secondary control circuit path implement Proportional Integral Derivative (PID) control, the transfer functions $H_A(\omega)$ and $H_B(\omega)$ have the form $K_P + K_I s + K_D s$. The integrator and differentiator coefficients ($K_I$ and $K_D$) may be adjusted to set the bandwidth. Alternatively, FIG. 2 shows one or more filters may be implemented in the digital domain 214 in the output path of the ADC 202. A low pass filter 228 may be implemented before controller 206 so that all the artifacts of the non-DC signal are ignored by controller 206, thereby alleviating stability concerns. Similarly, a band-pass, or high pass filter 230 (e.g., a finite impulse response (FIR) filter) may be implemented prior to, or within, the controller 210 for the secondary circuit path depending on the number and frequencies of the generated waveforms. Starting the upper DAC channel with the low pass filter 228 sets the upper DAC channel in FIG. 2 as the DC or low frequency control circuit path. Starting the lower DAC channel with the bandpass or high pass filter 230 sets the lower DAC channel as the higher frequency circuit path.

Figure 3:
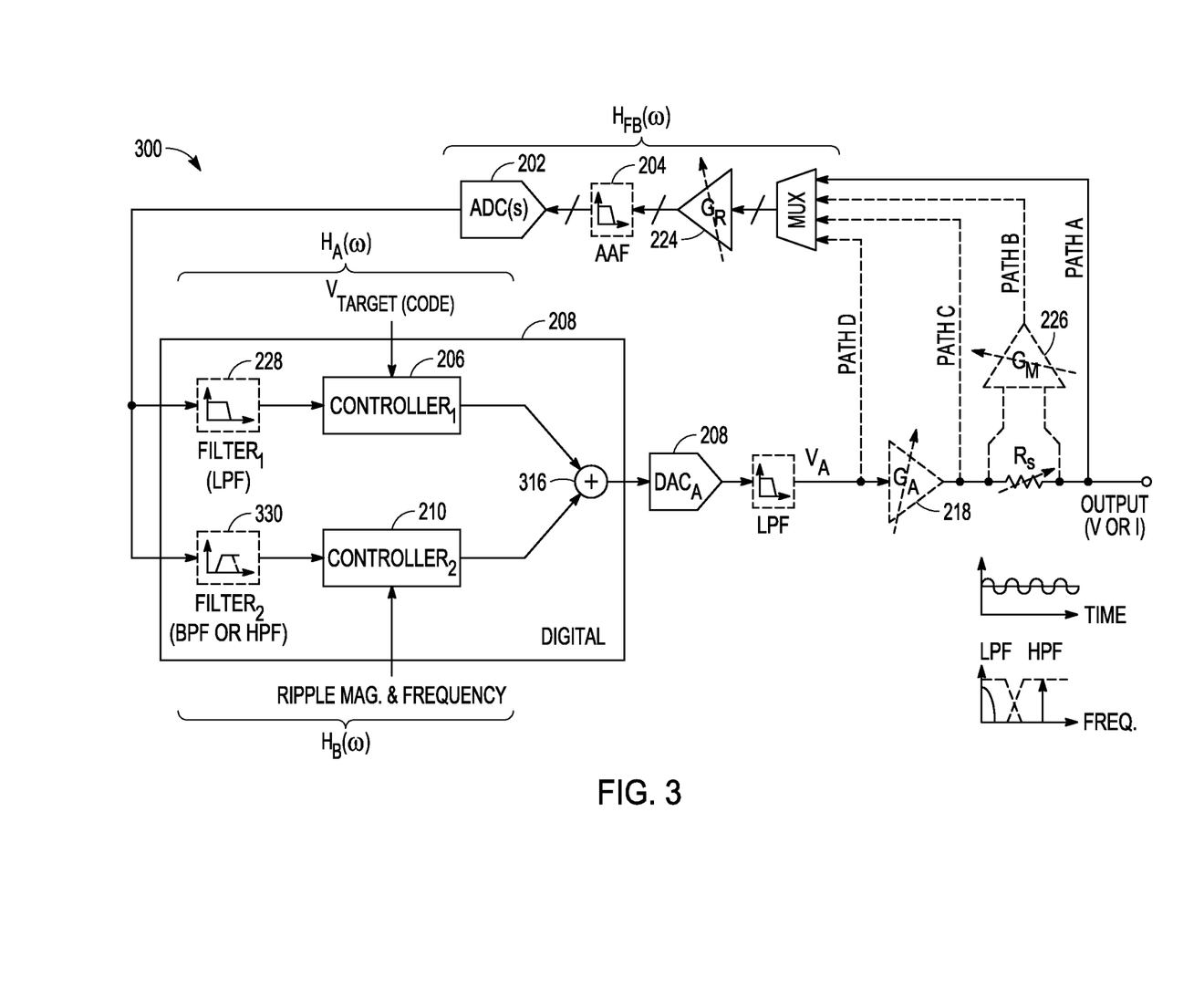
FIG. 3 is a circuit diagram of another example of a circuit supply system.

FIG. 3 is a circuit diagram of another example of a circuit supply system 300. Instead of the two DAC example in FIG. 2, the system 300 uses only a main DAC circuit 208 to implement a primary closed loop with transfer function $H_A(\omega)$*$H_{FB}(\omega)$ and either a secondary closed loop $H_B(\omega)$ *$H_{FB}(\omega)$ or an open loop secondary control circuit path $H_B(\omega)$. The summing element 316 is moved from analog domain to the digital domain 314. The main DAC 208 receives the sum of the output of the first controller 206 and the output of the second controller 210 to generate the DC output level and the non-DC signal. The bandwidth of the lower frequency transfer function of the primary control circuit path $H_A(\omega)$, and the higher frequency secondary control circuit path, $H_B(\omega)$, may be set using digital filtering in each path as well as in the corresponding controller 206, 210. In some examples, the circuit supply system includes one controller for both the primary control circuit path and the secondary control circuit path. The controller implements both the transfer function of the primary control circuit path $H_A(\omega)$ and the transfer function of the secondary control circuit path $H_B(\omega)$.

Returning to FIG. 2, the example system shows one secondary circuit path or one secondary DAC channel, and one feedback circuit path or one ADC channel. In some examples, the system 200 includes additional parallel DAC and ADC channels with corresponding filtering and controllers. For instance, additional DAC channels may be added to generate and control artifact waveforms at different frequencies. Two or more tones with offset frequencies may be generated to enable intermodulation distortion (IMD) measurements. One ADC channel is used to selectively measure output voltage, output current, or different circuit output paths (paths A-D). In another embodiment, additional ADC feedback paths may be added to measure output voltages and output currents concurrently. Alternatively, different ADCs may be employed to monitor artifacts at different frequencies or with different range and resolution requirements.

Figure 4:
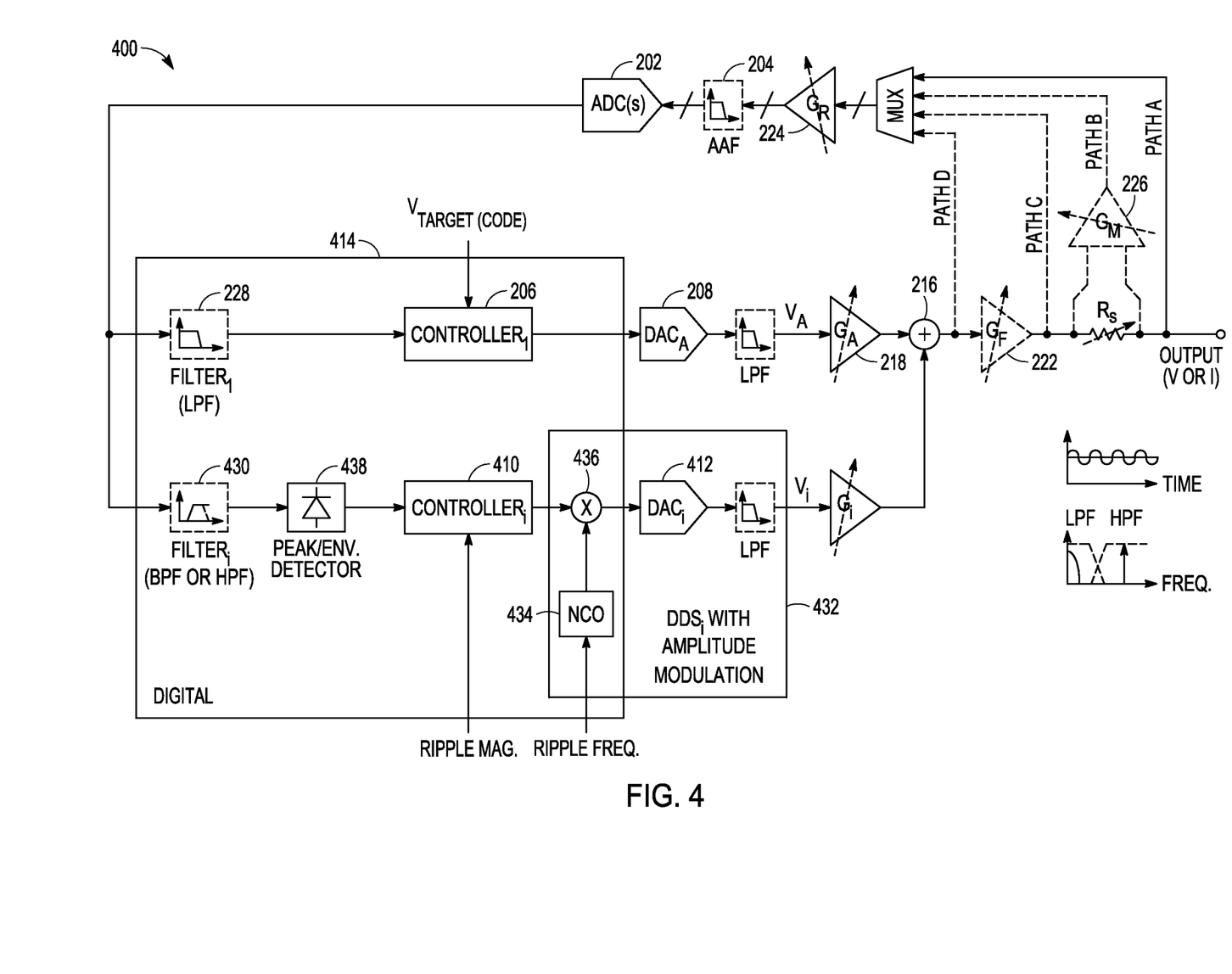
FIG. 4 is a circuit diagram of another example of a circuit supply system that includes a direct digital synthesizer (DDS) and a numerically controlled oscillator (NCO).

FIG. 4 is a circuit diagram of another example of a circuit supply system 400. The example is a multi-DAC system including a primary control circuit path that includes a controller 206 a main DAC circuit 208. The system 400 also includes one or more secondary control circuit paths that each include a filter 430 (Filter$_i$, i=1, . . . N), a controller 410 (Controller$_i$), and a DAC 412 (DAC$_i$). The DACs (DAC$_i$) are configured as direct digital synthesizers 432 (DDS$_i$). The number of DDS blocks in the system, N, may be configured depending on the number of dedicated DACs and controllers.

The digital circuitry of the DDS 432 includes a numerically controlled oscillator (NCO) 434. The NCO 434 generates a non-DC signal (e.g., a ripple signal) that has a periodic waveform (e.g., sinusoidal waveform, triangular waveform, square waveform, pulsed waveform, etc.). If the non-DC signal is a ripple signal, the frequency of the ripple signal can be selectable by a user. A multiplier 436 may multiply the digital value output from the second controller by the output of the NCO 434 to provide a digital ripple signal to the DAC$_i$ 412. The Controller$_i$ 410 can provide an output that controls the amplitude of the ripple waveform.

In some examples, the DDS 432 includes a peak or envelope detector 438. The peak or envelope detector function can be implemented in the digital domain 414 or can be a separate peak or envelope detector circuit. Having the peak or envelope detector function separate from the Controller$_i$ 410, allows the Controller$_i$ 410 to run at a significantly reduced (baseband) speed or bandwidth.

Figure 5A:
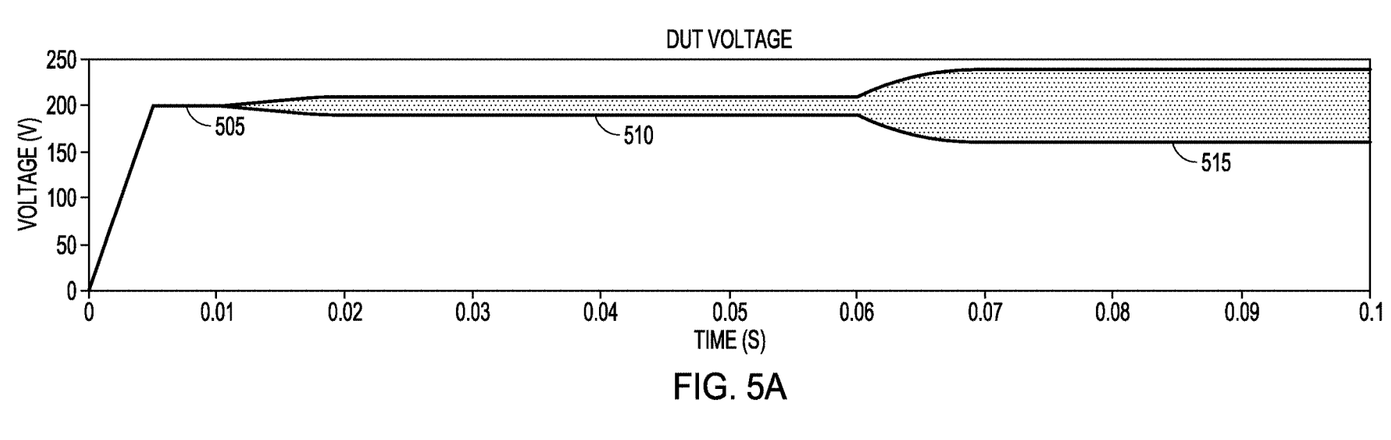
FIGS. 5A-5D show simulations of ripple signal generation using a circuit supply system.
Figure 5B:
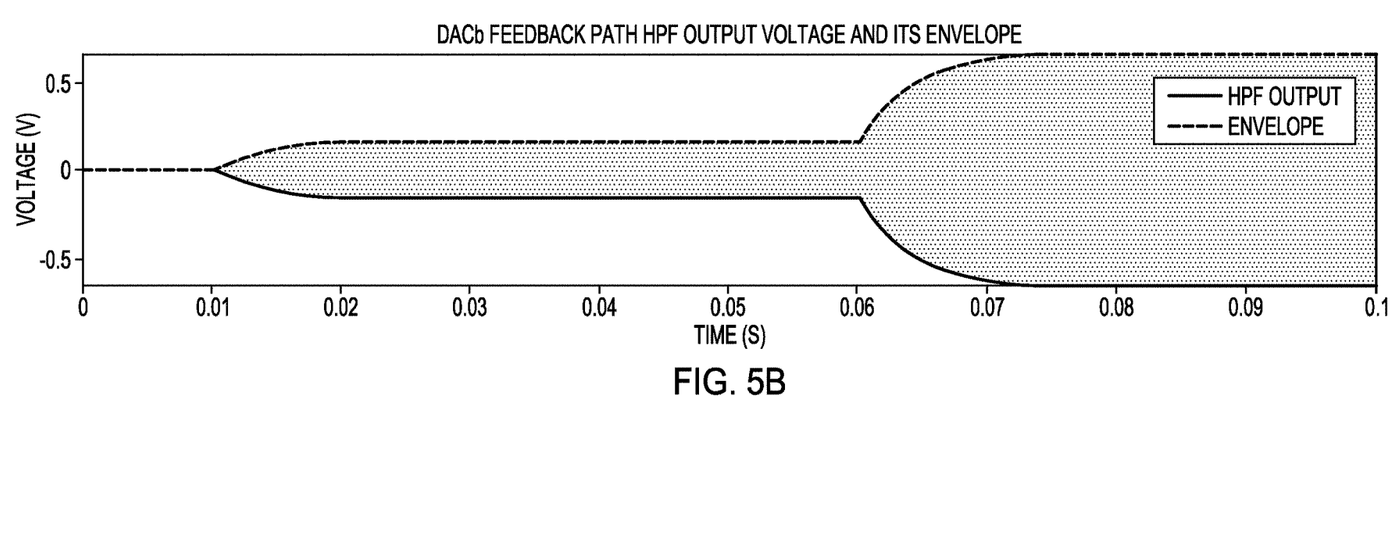
Figure 5C:
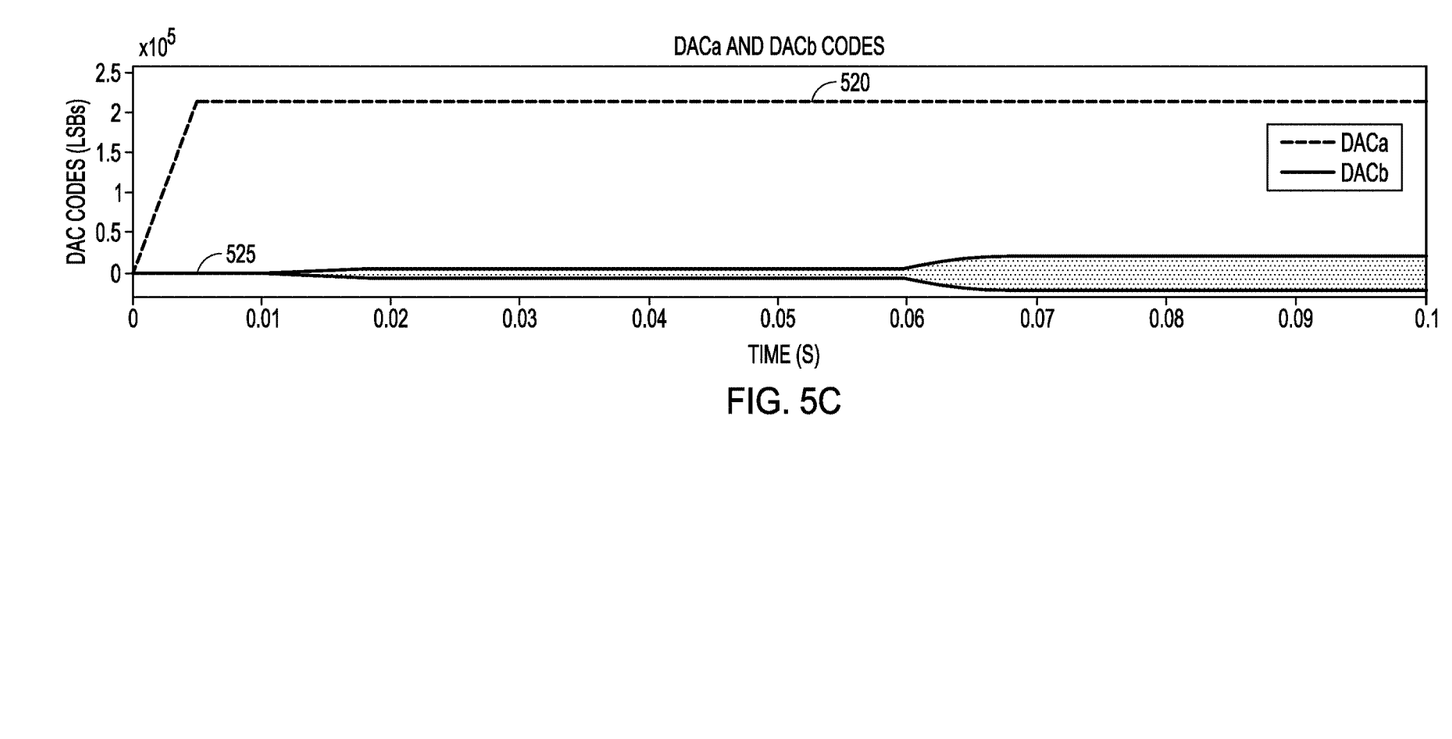
Figure 5D:
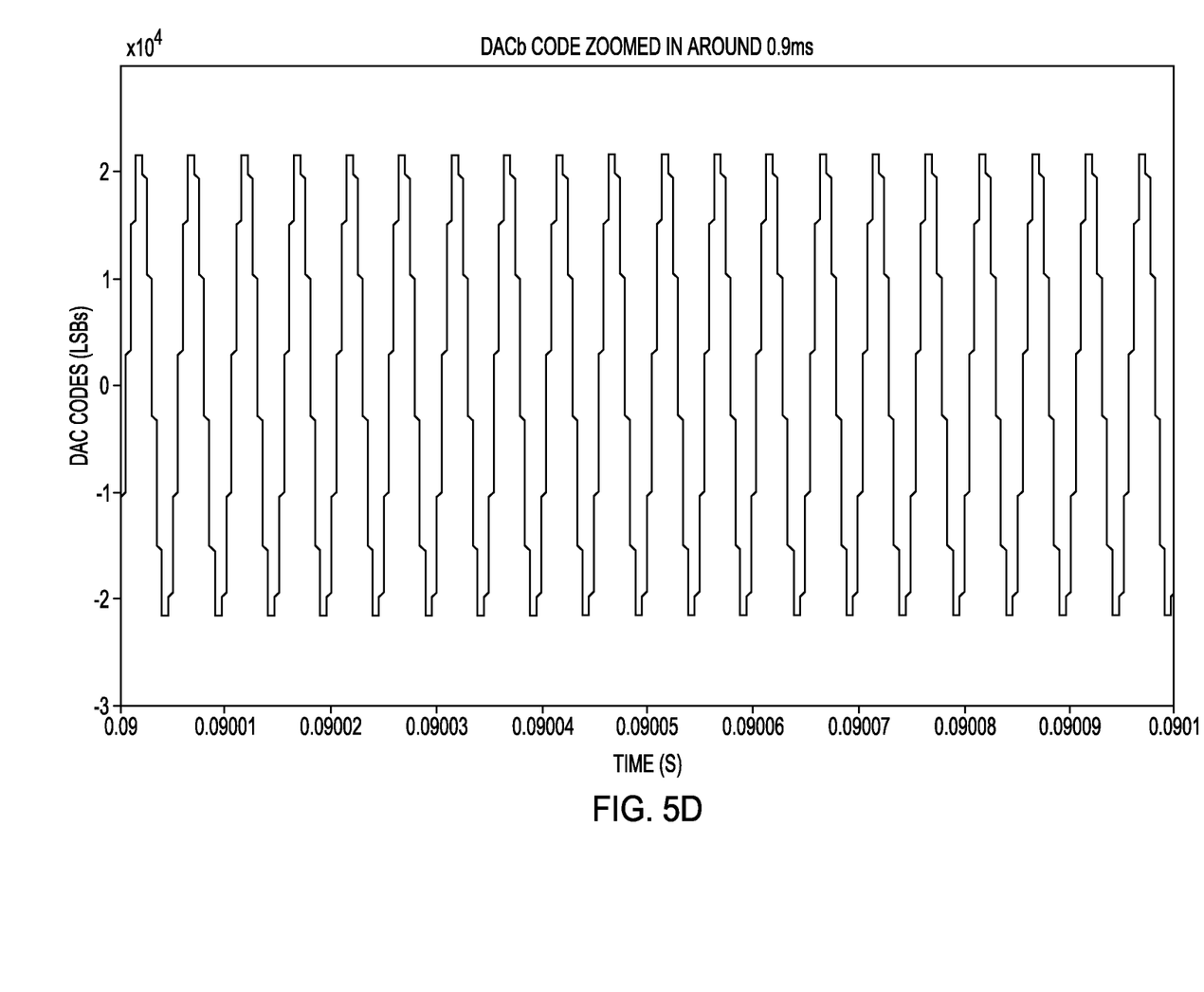

FIGS. 5A-5D show simulations of ripple signal generation using a circuit supply system. FIG. 5A is a simulated output voltage waveform of an example embodiment of the circuit supply system 400 of FIG. 4. The primary control circuit path works to maintain a constant power supply output 505 of 200V. The secondary control circuit path adds a 10 volt peak-to-peak (10Vp-p) ripple signal 510 and a 40Vp-p ripple signal 515 onto the 200V output. FIG. 5B shows the envelope waveform output of the high pass filter 430. FIG. 5C shows the DAC code updates for the main DAC 520 and for the second DAC 525. The waveforms shows that the DAC of the primary closed loop is undisturbed. FIG. 5D shows a zoomed-in view of the DAC Code updates 525 near 0.09 seconds in FIG. 5C.

Figure 6:
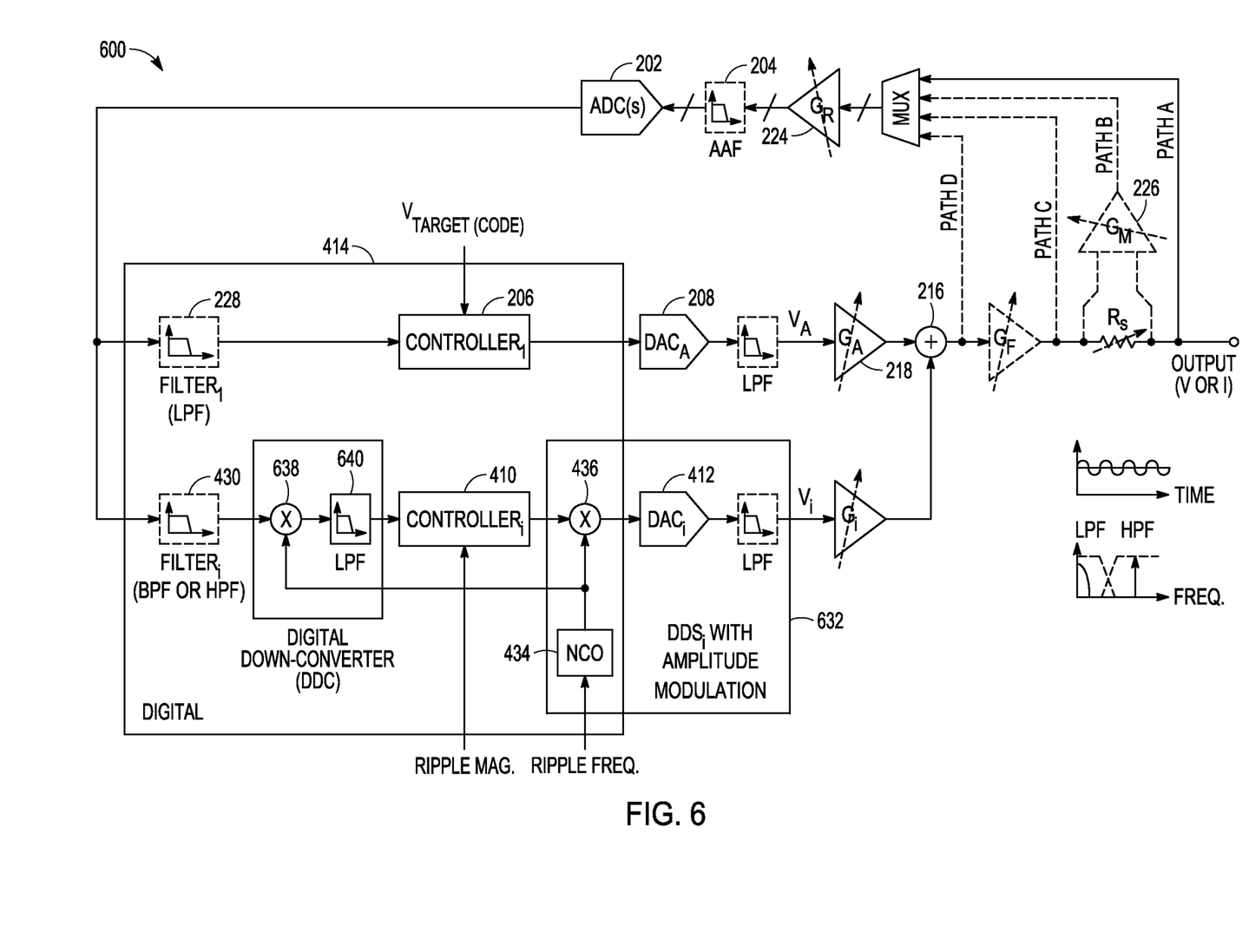
FIG. 6 is a circuit diagram of another example of a circuit supply system that includes a digital down converter (DDC).

FIG. 6 is a circuit diagram of another example of a circuit supply system 600. The system 600 is similar to the example system of FIG. 4 in that it includes a primary control circuit path that includes a controller 206 a main DAC circuit 208, and one or more that are configured as direct digital synthesizers 432 (DDS$_i$). The example in FIG. 6 mathematically provides ripple envelope tracking. The system 600 includes the NCO 434 and multiplier 436. A ripple waveform signal is captured in digital form at the output of the Filter$_i$ 430. The output of Filter$_i$ is digitally down converted to baseband using multiplication operation by multiplier 638. The multiplier 638 can be implemented in one or more of hardware, software, or firmware of the digital domain.

When the output of the NCO 434 is multiplied by the ripple waveform signal in digital form (at the output of Filter$_i$), the output of the multiplier 640 contains a low-frequency term near DC and another term at twice (2×) the Ripple Frequency. A low-pass filter (LPF) 640 is included at the output of the multiplier 638 to filter out the 2× Ripple Frequency term. Consequently, only the low-frequency component that contains the amplitude envelope information for the ripple signal is passed to Controller$_i$ 410.

In some examples, the NCOs 434 of FIGS. 4 and 6 could be replaced by a noise generator circuit. The generated noise may be random noise or pseudo-random (PRN). Random noise generally has a spectrally flat AC response, commonly called a white spectral response as it contains all the spectral colors. In practice, random noise may be approximated using PRN generated by a pseudo-random bit sequencer (PRBS). The random noise or PRN generated may have a flat spectral output response or it may have a different target spectral response including a lower frequency response and a higher frequency response. The noise may also be generated to have an alternating current (AC) response within a target specific frequency band. In some examples, the noise may be flicker (1/f) noise.

In some examples, the ripple signal generation and noise signal generation are combined in a closed-loop system. Nested control loops may work sufficiently independently with careful frequency planning (spacing) and filtering. Alternatively, orthogonal pseudo-noise (PN) sequences may be decoded in time domain by the corresponding controller.

Like the ripple signal generator examples, the average magnitude or the power of the noise signal may be tracked using the secondary control circuit path to control the average or root-mean-square (RMS) value. The noise generated in secondary control circuit path may be high-pass filtered. Delta-sigma modulation (DSM) may be employed to push the noise power to sufficiently high frequencies so that the primary control circuit path is not significantly affected. In another embodiment, the added noise or ripple signal may be dithered in time-domain by dithering the clock input of the corresponding DAC to reduce spectral tones at the output.

In another use case of the multi-DAC architecture, the effective resolution of the circuit supply system may be increased by having the controller toggle one or more of the secondary control circuit path DACs between two or more levels according to a pre-determined sequence such that the average value of the toggled signal is less than an LSB. For instance, in a two DAC system (e.g., the system 200 in FIG. 2 with DAC 208 responsible for DC output generation and DAC 212 responsible for resolution enhancement) where both DACs have the same resolution (e.g., same number of bits), DAC 212 may be allowed to toggle up and down one LSB with a given duty cycle. If the duty cycle is 50% than the average value of the toggle would be ½ LSB. Quantization noise shaping techniques such as delta-sigma modulation (DSM), pulse density modulation (PDM), and pulse width modulation (PWM) may also be applied. In such an application, the sample rate of DAC 212 may be significantly higher (e.g., 16X or 20X higher) compared to the sampling rate of DAC 208 so that the upconverted quantization noise can be filtered out by the main loop controlled by DAC 208. To reduce the ripple at the output due to toggling DAC 212 the sampling edge of DAC 212 may be dithered with respect to DAC 208 in a random or probabilistic fashion to spread ripple energy over a wider frequency range. The toggling may be configured to match a particular use case need. Similarly, the resolution of the measuring ADC 202 may be enhanced by oversampling, noise shaping, averaging, and dithering techniques enabling overall resolution enhancement of the closed-loop system.

System and methods have been described for artifact generation (ripple and noise) and control that are implemented in closed-loop DAC architectures. The artifact signals are generated using direct digital synthesis (DDS) or arbitrary waveform generation (AWG) techniques in a closed-loop approach. The artifact signals are added on top of a steady DC operating voltage (or current) maintained by the controller of the primary DC operating loop. The artifact signals may be directly added to the output without significantly disrupting the stability of the primary DC operating loop. In addition, the techniques described provide precise closed-loop control of the magnitude or power of the artifact waveform. In a further example, DACs used for artifact signal generation may be repurposed to enhance the resolution of the steady DC operating voltage by controlled toggling between two or more levels according to a pre-determined sequence such that the average value of the toggled signal is less than an LSB.

Additional Description and Examples

Example 1 includes subject matter (such as a circuit supply system) comprising a main digital to analog converter (DAC) circuit to produce a direct current (DC) output level at a system output; a feedback circuit path connected to the system output; a primary control circuit path connected to the feedback circuit path and configured to regulate the DC output level at the system output using the main DAC circuit and the feedback circuit path; and a secondary control circuit path connected to the feedback circuit path and configured to add a non-DC signal component to the DC output level and regulate the non-DC signal component using the feedback circuit path.

In Example 2, the subject matter of Example 1 optionally includes a primary control circuit path that includes a first controller and the main DAC circuit; a secondary control circuit path that includes a second controller and a second DAC circuit configured to produce the non-DC signal component; and a summing node operatively coupled to an output of the main DAC circuit and an output of the second DAC and configured to add the non-DC signal component to the DC output level.

In Example 3, the subject matter of Example 1 optionally includes a primary control circuit path that includes a first controller; a secondary control circuit path that includes a second controller; and a main DAC circuit configured to receive a sum of an output of the first controller and an output of the second controller to generate the DC output level and the non-DC signal component.

In Example 4, the subject matter of one or any combination of Examples 1-3 optionally includes a feedback circuit path that includes an analog to digital converter (ADC) circuit; a controller connected to the ADC circuit of the feedback circuit; a primary control circuit path having a first transfer function; a secondary control circuit path that includes a second transfer function; and the controller is configured to implement the first and second transfer functions.

In Example 5, the subject matter of one or any combination of Examples 1-4 optionally includes a primary control circuit path that includes a low pass filter circuit configured to provide a first frequency signal component of the system output to the primary control circuit path; and a secondary control circuit path that includes one of a high pass filter or a bandpass filter configured to provide a second signal component of the system output to the secondary control circuit path, wherein the second signal component has a higher frequency than the first frequency signal component.

In Example 6, the subject matter of one or any combination of Examples 1 and 4-5 optionally includes a primary control circuit path includes a first controller and the main DAC circuit; and a secondary control circuit path that includes a second controller to output a digital value; a second DAC circuit configured to produce an analog ripple signal as the non-DC signal; a numerically controlled oscillator (NCO); a multiplier configured to multiply the digital value of the second controller by an output of the NCO to provide a digital ripple signal to the second DAC circuit; and at least one of a peak detector or an envelope detector configured to monitor an amplitude of the analog ripple signal to the second controller.

In Example 7, the subject matter of one or any combination of Examples 1 and 4-5 optionally includes a primary control circuit path includes a first controller and the main DAC circuit; and a secondary control circuit path that includes a second controller to output a digital value; a second DAC circuit configured to produce an analog ripple signal as the non-DC signal component; a numerically controlled oscillator (NCO); a first multiplier configured to multiply a signal received from the feedback circuit path by the output of the NCO and provide a product signal including amplitude envelope information to the second controller; and a second multiplier configured to multiply the digital value of the second controller by an output of the NCO to provide a digital ripple signal to the second DAC circuit.

In Example 8, the subject matter of one or any combination of Examples 1-7 optionally includes at least one controller connected to the feedback circuit path; another control circuit path; and a secondary control circuit path configured to produce a ripple signal and regulate the ripple signal using the first feedback circuit path. The other control circuit path is configured to produce a noise signal; and the at least one controller is configured to selectively add one or both of the ripple signal and the noise signal to the DC output level.

In Example 9, the subject matter of one or any combination of Examples 1-8 optionally includes a feedback circuit is configured to feedback an output voltage signal at the system output to the primary control circuit path and the secondary control circuit path; and another feedback circuit path configured to feedback an output current signal at the system output to the primary control circuit path and the secondary control circuit path.

Example 10 includes subject matter (such as a method of operating a circuit supply system) or can optionally be combined with one or any combination of Examples 1-9 to include such subject matter, comprising producing a direct-current (DC) output level at a system output of the circuit supply system using a primary control circuit path and a main digital to analog converter (DAC) circuit; producing an output signal at the system output by adding a non-DC signal component to the DC output level using a secondary control circuit path; and regulating the DC output level and regulating the non-DC signal component using a feedback circuit path connected to the system output and to both of the primary control circuit path and the secondary control circuit path.

In Example 11, the subject matter of Example 10 optionally includes producing the DC output level using the primary control circuit path and the main DAC circuit that is included in the primary control circuit path, and producing a ripple signal using a second DAC circuit included in the secondary control circuit path and adding the ripple signal to the DC output level by summing outputs of the primary control circuit path and the secondary control circuit path.

In Example 12, the subject matter of one or both of Examples 10 and 11 optionally includes summing an output of a controller of the primary control circuit path and an output of a controller of the secondary control circuit path; and applying the sum of the outputs of the controllers to an input of the main DAC circuit.

In Example 13, the subject matter of one or any combination of Examples 10-12 optionally includes feeding back the output signal from the system output using the feedback circuit path, wherein the output signal includes DC output level and a ripple signal as the non-DC signal component, converting the output signal to a digital electrical signal that includes a digital ripple signal and the DC output level, and separating the digital ripple signal from the DC output level and applying the separated digital ripple signal to the secondary control circuit path and the DC output level to the primary control circuit path.

In Example 14, the subject matter of one or any combination of Examples 10-13 optionally includes producing the ripple signal using a numerically controlled oscillator (NCO) included in the secondary control circuit path, and regulating the ripple signal by adjusting the NCO according to an amplitude of the separated digital ripple signal.

In Example 15, the subject matter of Example 14 optionally includes multiplying the separated digital ripple signal by an output of the NCO to produce a product signal, and filtering the product signal to produce an envelope signal that includes amplitude information of the separated digital ripple signal.

In Example 16, the subject matter of one or any combination of Examples 10-15 optionally includes multiplying an output of a controller of the secondary control circuit path with an output of a numerically controlled oscillator (NCO), and applying the multiplied outputs to a second DAC circuit included in the secondary control circuit path to produce a ripple signal as the non-DC signal component added to the DC output level.

In Example 17, the subject matter of one or any combination of Example 10-17 optionally includes producing the output signal at the system output by adding a noise signal to the DC output level using the secondary control circuit path.

Example 18 includes subject matter (such as a supply circuit) or can optionally be combined with one or any combination of Examples 1-17 to include such subject matter, comprising a primary circuit path including a main digital to analog converter (DAC) circuit; a secondary circuit path including a second DAC circuit; a summing circuit node connected to an output of the primary circuit path and to an output of the secondary circuit path to produce an output signal at an output of the supply circuit; a feedback circuit path connected to the output of the supply circuit and the primary circuit path; and a control circuit. The feedback circuit includes an analog to digital converter (ADC) circuit to produce a feedback signal. The control circuit is configured to set an input of the main DAC circuit to produce a direct current (DC) output level at the output of the supply circuit based on the feedback signal; and toggle the second DAC circuit between two output levels corresponding to one least significant bit (LSB) of the main DAC circuit.

In Example 19, the subject matter of Example 18 optionally includes low pass filter circuit including an input connected to the summing node; a controller configured to sample the feedback signal at a sampling frequency and toggle the second DAC circuit at a toggle frequency higher than the sampling frequency; and the toggle frequency is in a stop band of the low pass filter.

In Example 20, the subject matter of one or both of Examples 18 and 19 optionally includes a controller configured to sample the feedback signal using a sampling signal and toggle the second DAC circuit using a toggling signal; and dither an edge of the toggling signal with respect to an edge of the sampling signal.

These non-limiting examples can be combined in any permutation or combination. The above detailed description includes references to the accompanying drawings, which form a part of the detailed description. The drawings show, by way of illustration, specific embodiments in which the invention can be practiced. These embodiments are also referred to herein as "examples." All publications, patents, and patent documents referred to in this document are incorporated by reference herein in their entirety, as though individually incorporated by reference. In the event of inconsistent usages between this document and those documents so incorporated by reference, the usage in the incorporated reference(s) should be considered supplementary to that of this document; for irreconcilable inconsistencies, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In the appended claims, the terms "including" and "in which" are used as the plain-English equivalents of the respective terms "comprising" and "wherein." Also, in the following claims, the terms "including" and "comprising" are open-ended, that is, a system, device, article, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects. Method examples described herein can be machine or computer-implemented at least in part.

What is claimed is:

1. A circuit supply system comprising:
   a main digital to analog converter (DAC) circuit to produce a direct current (DC) output level at a system output;
   a feedback circuit path connected to the system output;
   a primary control circuit path connected to the feedback circuit path and configured to regulate the DC output level at the system output using the main DAC circuit and the feedback circuit path; and
   a secondary control circuit path connected to the feedback circuit path and configured to add a non-DC signal component to the DC output level and regulate the non-DC signal component using the feedback circuit path.

2. The circuit supply system of claim 1,
   wherein the primary control circuit path includes a first controller and the main DAC circuit;
   wherein the secondary control circuit path includes a second controller and a second DAC circuit configured to produce the non-DC signal component; and
   a summing node operatively coupled to an output of the main DAC circuit and an output of the second DAC and configured to add the non-DC signal component to the DC output level.

3. The circuit supply system of claim 1,
   wherein the primary control circuit path includes a first controller;
   wherein the secondary control circuit path includes a second controller; and
   wherein main DAC circuit is configured to receive a sum of an output of the first controller and an output of the second controller to generate the DC output level and the non-DC signal component.

4. The circuit supply system of claim 1,
   wherein the feedback circuit path includes an analog to digital converter (ADC) circuit;
   a controller connected to the ADC circuit of the feedback circuit path;
   wherein the primary control circuit path has a first transfer function;
   wherein the secondary control circuit path has a second transfer function; and
   wherein the controller is configured to implement the first and second transfer functions.

5. The circuit supply system of claim 1,
   wherein the primary control circuit path includes a low pass filter circuit configured to provide a first frequency signal component of the system output to the primary control circuit path; and
   wherein the secondary control circuit path includes one of a high pass filter or a bandpass filter configured to provide a second signal component of the system output to the secondary control circuit path, wherein the second signal component has a higher frequency than the first frequency signal component.

6. The circuit supply system of claim 1,
wherein the primary control circuit path includes a first controller and the main DAC circuit;
wherein the secondary control circuit path includes:
a second controller to output a digital value;
a second DAC circuit configured to produce an analog ripple signal as the non-DC signal;
a numerically controlled oscillator (NCO);
a multiplier configured to multiply the digital value of the second controller by an output of the NCO to provide a digital ripple signal to the second DAC circuit; and
at least one of a peak detector or an envelope detector configured to monitor an amplitude of the analog ripple signal to the second controller.

7. The circuit supply system of claim 1,
wherein the primary control circuit path includes a first controller and the main DAC circuit;
wherein the secondary control circuit path includes:
a second controller to output a digital value;
a second DAC circuit configured to produce an analog ripple signal as the non-DC signal component;
a numerically controlled oscillator (NCO);
a first multiplier configured to multiply a signal received from the feedback circuit path by the output of the NCO and provide a product signal including amplitude envelope information to the second controller; and
a second multiplier configured to multiply the digital value of the second controller by an output of the NCO to provide a digital ripple signal to the second DAC circuit.

8. The circuit supply system of claim 1, including:
at least one controller connected to the feedback circuit path;
another control circuit path;
wherein the secondary control circuit path is configured to produce a ripple signal and regulate the ripple signal using the first feedback circuit path;
wherein the other control circuit path is configured to produce a noise signal; and
wherein the at least one controller is configured to selectively add one or both of the ripple signal and the noise signal to the DC output level.

9. The circuit supply system of claim 1,
wherein the feedback circuit is configured to feedback an output voltage signal at the system output to the primary control circuit path and the secondary control circuit path; and
another feedback circuit path configured to feedback an output current signal at the system output to the primary control circuit path and the secondary control circuit path.

10. A method of operating a circuit supply system, the method comprising:
producing a direct-current (DC) output level at a system output of the circuit supply system using a primary control circuit path and a main digital to analog converter (DAC) circuit;
producing an output signal at the system output by adding a non-DC signal component to the DC output level using a secondary control circuit path; and
regulating the DC output level and regulating the non-DC signal component using a feedback circuit path connected to the system output and to both of the primary control circuit path and the secondary control circuit path.

11. The method of claim 10,
wherein the producing the DC output level includes producing the DC output level using the primary control circuit path and the main DAC circuit that is included in the primary control circuit path; and
wherein the adding the non-DC signal component to the DC output level includes producing a ripple signal using a second DAC circuit included in the secondary control circuit path and adding the ripple signal to the DC output level by summing outputs of the primary control circuit path and the secondary control circuit path.

12. The method of claim 10, wherein adding the non-DC signal component to the DC output level includes:
summing an output of a controller of the primary control circuit path and an output of a controller of the secondary control circuit path; and
applying the sum of the outputs of the controllers to an input of the main DAC circuit.

13. The method of claim 10, including:
feeding back the output signal from the system output using the feedback circuit path, wherein the output signal includes DC output level and a ripple signal as the non-DC signal component;
converting the output signal to a digital electrical signal that includes a digital ripple signal and the DC output level; and
separating the digital ripple signal from the DC output level and applying the separated digital ripple signal to the secondary control circuit path and the DC output level to the primary control circuit path.

14. The method of claim 13, including:
producing the ripple signal using a numerically controlled oscillator (NCO) included in the secondary control circuit path; and
wherein regulating the non-DC signal component includes regulating the ripple signal by adjusting the NCO according to an amplitude of the separated digital ripple signal.

15. The method of claim 14, including:
multiplying the separated digital ripple signal by an output of the NCO to produce a product signal; and
filtering the product signal to produce an envelope signal that includes amplitude information of the separated digital ripple signal.

16. The method of claim 10, wherein adding the non-DC signal component to the DC output level using a secondary control circuit path includes:
multiplying an output of a controller of the secondary control circuit path with an output of a numerically controlled oscillator (NCO); and
applying the multiplied outputs to a second DAC circuit included in the secondary control circuit path to produce a ripple signal as the non-DC signal component added to the DC output level.

17. The method of claim 10, wherein the producing the output signal includes producing the output signal at the system output by adding a noise signal to the DC output level using the secondary control circuit path.

18. A supply circuit comprising:
a primary circuit path including a main digital to analog converter (DAC) circuit;
a secondary circuit path including a second DAC circuit;
a summing circuit node connected to an output of the primary circuit path and to an output of the secondary circuit path to produce an output signal at an output of the supply circuit;

a feedback circuit path connected to the output of the supply circuit and the primary circuit path, wherein the feedback circuit includes an analog to digital converter (ADC) circuit to produce a feedback signal; and a controller configured to:
- set an input of the main DAC circuit to produce a direct current (DC) output level at the output of the supply circuit based on the feedback signal; and
- toggle the second DAC circuit between two output levels corresponding to one least significant bit (LSB) of the main DAC circuit.

19. The supply circuit of claim 18, including:

a low pass filter circuit including an input connected to the summing node;

wherein the controller is configured to sample the feedback signal at a sampling frequency and toggle the second DAC circuit at a toggle frequency higher than the sampling frequency; and wherein the toggle frequency is in a stop band of the low pass filter.

20. The supply circuit of claim 18, wherein the controller is configured to:

sample the feedback signal using a sampling signal and toggle the second DAC circuit using a toggling signal; and dither an edge of the toggling signal with respect to an edge of the sampling signal.

\* \* \* \* \*